US010351729B2

(12) United States Patent
Brotzman et al.

(10) Patent No.: US 10,351,729 B2
(45) Date of Patent: Jul. 16, 2019

(54) POLYSILOXANE FILMS AND METHODS OF MAKING POLYSILOXANE FILMS

(71) Applicant: Motorola Mobility LLC, Chicago, IL (US)

(72) Inventors: Richard W Brotzman, Naperville, IL (US); Ernest Sirois, Crystal Lake, IL (US); Deborah Paskiewicz, Downers Grove, IL (US)

(73) Assignee: MOTOROLA MOBILITY LLC, Chicago, IL (US)

( * ) Notice: Subject to any disclaimer, the term of this patent is extended or adjusted under 35 U.S.C. 154(b) by 171 days.

(21) Appl. No.: 15/059,665

(22) Filed: Mar. 3, 2016

(65) Prior Publication Data

US 2017/0253765 A1    Sep. 7, 2017

(51) Int. Cl.
| | | |
|---|---|---|
| *C09D 183/04* | (2006.01) | |
| *H05K 1/18* | (2006.01) | |
| *C09D 183/08* | (2006.01) | |
| *H05K 3/28* | (2006.01) | |
| *C08G 77/24* | (2006.01) | |
| *C08G 77/00* | (2006.01) | |

(52) U.S. Cl.
CPC ......... *C09D 183/04* (2013.01); *C09D 183/08* (2013.01); *H05K 1/18* (2013.01); *H05K 3/282* (2013.01); *H05K 3/285* (2013.01); *C08G 77/24* (2013.01); *C08G 77/80* (2013.01); *H05K 2201/0162* (2013.01); *H05K 2201/09872* (2013.01); *H05K 2201/10015* (2013.01); *H05K 2201/10022* (2013.01); *H05K 2203/095* (2013.01)

(58) Field of Classification Search
CPC ...... C09D 183/04; C09D 183/08; H05K 1/18; H05K 3/282; H05K 3/285; H05K 2201/0162; H05K 2201/09872; H05K 2201/10015; H05K 2201/10022; H05K 2203/095; C08G 77/24; C08G 77/80
See application file for complete search history.

(56) References Cited

U.S. PATENT DOCUMENTS

| | | | | |
|---|---|---|---|---|
| 4,844,986 | A | * | 7/1989 | Karakelle ............. A61L 29/085 428/447 |
| 2001/0021749 | A1 | * | 9/2001 | Yeats ................. C09D 133/068 525/100 |
| 2005/0014391 | A1 | | 1/2005 | Shioya et al. |
| 2006/0131700 | A1 | * | 6/2006 | David ................. H01L 21/4846 257/632 |

(Continued)

FOREIGN PATENT DOCUMENTS

| | | |
|---|---|---|
| JP | 62106806 A | 5/1987 |
| JP | 63305365 A | 12/1988 |

(Continued)

*Primary Examiner* — Travis M Figg
(74) *Attorney, Agent, or Firm* — Kunzler Bean & Adamson

(57) ABSTRACT

A polysiloxane film comprises Si—O bonds and has a thickness of 0.3 to 1.5 microns. Adjacent electrodes coated with the polysiloxane film have a leakage current of at most 0.01 mA at 10 V after contact with water. An electrode coated with the polysiloxane film has a contact resistance of at least 0.01 ohms at 1.0 mm of pogo pin compression under a 1.0 N load. The polysiloxane film provides IPx7 protection from ingress of water.

10 Claims, 16 Drawing Sheets

(56) References Cited

U.S. PATENT DOCUMENTS

| | | | |
|---|---|---|---|
| 2006/0251905 A1* | 11/2006 | Arakawa | B32B 27/08 |
| | | | 428/429 |
| 2008/0102206 A1* | 5/2008 | Wagner | B05D 1/62 |
| | | | 427/255.7 |
| 2008/0125510 A1* | 5/2008 | Crosby | C08F 265/04 |
| | | | 522/99 |
| 2009/0054612 A1 | 2/2009 | Jung et al. | |
| 2009/0126404 A1* | 5/2009 | Sakhrani | C03C 17/3405 |
| | | | 65/30.1 |
| 2010/0026760 A1 | 2/2010 | Matsuo | |
| 2010/0323127 A1 | 2/2010 | Rhoton et al. | |
| 2010/0063222 A1* | 3/2010 | Oikawa | C08F 283/12 |
| | | | 525/474 |
| 2014/0024758 A1* | 1/2014 | Sekito | G02B 1/105 |
| | | | 524/317 |
| 2015/0141570 A1* | 5/2015 | Buckanin | C09D 183/04 |
| | | | 524/588 |

FOREIGN PATENT DOCUMENTS

| | | |
|---|---|---|
| JP | 05140356 A | 6/1993 |
| JP | 2003055461 A | 2/2003 |
| WO | 2017/051019 A1 | 3/2017 |

\* cited by examiner

POLYSILOXANE FILMS AND METHODS OF MAKING POLYSILOXANE FILMS

BACKGROUND

Many electronic devices include multiple electronic components attached to a substrate, such as a printed circuit board (PCB). The substrate provides physical support to electronic components including integrated circuits, electronic subassemblies, capacitors, resistors and similar devices, and provides connection paths to electrically connect the components to form electrical circuits which are required for a functioning electronic device.

Electronic devices may fail to function if their electronic components become damaged, such as by exposure to dust or water. Water is particularly harmful for electronic devices as electronic components are likely to electrically short or malfunction after brief exposure to liquids or moisture. Specifically, exposed metal areas having voltage differentials in close proximity can easily experience short circuit events when corrosion or water immersion bridges the gap between such areas. The electronic components of electronic devices may be surface treated with a protective material, such as a film, to provide mechanical, electro-magnetic, and/or chemical protection. For example, electronic components may be surface treated with an epoxy-based compound to provide protection from environmental hazards.

Many electronic devices also include external components to protect the active electronic elements and ensure the functionality of the device. The external components may be designed to be a permanent part of the electronic device, or may be replaceable. External components include items such as lenses, lens covers or liners, antenna shields, thermal spreaders and similar components and may be made of glass, sapphire, plastic, or other materials with specific electromagnetic properties. These external components may be surface treated to provide mechanical, electro-magnetic, and/or chemical protection.

For example, a surface mount connector may have multiple leads that physically and electrically couple the connector to a printed circuit board. The body of the connector may be positioned off the printed circuit board while the leads are attached to bonding pads on the circuit board. A film may be used to seal the interface between the connector and the printed circuit board to prevent the ingress of moisture or various chemicals and allow the connector to remain mechanically compliant with the circuit board. Similarly, a mechanically tough external substrate may be coated with a film to prevent scratching, resist abrasive environments or bleed static charge accumulation.

The International Protection Marking (IEC standard 60529), also known as the IP Code, classifies and rates the degree of protection provided against intrusion (body parts such as hands and fingers), dust, accidental contact and water by mechanical casings and electrical enclosures. An IP code is expressed as IP##, with the first number referring to protection from solid particles and the second digit referring to protection from ingress of water. For water protection, level 0 is not protected from water, level 1 is protected from dripping water, level 2 is protected from dripping water when a device is at 15° tilt, level 3 is protected from spraying water, level 4 is protected from splashing of water, level 5 is protected from water jets, level 6 is protected from powerful water jets, level 6K is protected from powerful water jets with increased pressure, level 7 is protected from immersion in water up to 1 m of water for 30 minutes, level 8 is protected from continuous immersion in water beyond 1 m and level 9 is protected from powerful high temperature water jets. A value of "x" indicates that there is no data for the amount of protection provided.

A number of different films and treatment techniques have been developed to protect electronic devices from damage. For example, U.S. Pat. No. 8,492,898 to Ferdinandi et al., U.S. Pat. No. 8,163,356 to Coulson, and U.S. Pat. App. Pub. 2013/0240256 to Von Werne are directed to polymeric films for electronic devices to protect from water damage. These references describe the application of a hydrophobic polymeric film having a thickness between at least one to ten microns (1-10 µm) around electronic components on substrate assemblies. The film may be deposited by plasma-assisted chemical vapor deposition of fluorohydrocarbon monomers onto at least part of the substrate surface. The plasma process applies charges to the surface of the substrate so molecular fragments of the fluorohydrocarbon monomers created by the plasma, or pulsed plasma, may be bonded to the charged surface. These methods for applying a film involve placing the electronic component or substrate to be coated in a vacuum chamber having a pressure of about 10 to 200 torr. The vacuum chamber is filled with a gaseous or liquid fluorohydrocarbon monomer and a voltage is applied, creating plasma. Plasma constituents settle on and adhere to the electronic component or substrate, providing a water-resistant film on the surface.

Current commercially available protective films suffer a number of drawbacks. The large size of the fluorohydrocarbon monomers prevents them from diffusing through the entire reticulated structure of the substrate assemblies of electronic devices. The plasma deposition process also creates a distribution of molecular fragments from the fluorohydrocarbon monomer that do not readily wet the surfaces of the substrate assemblies. A failure to wet the surface of a substrate results in the formation of islands of film and incomplete encapsulation of the substrate assemblies. The process also forms hydrogen fluoride byproducts. Most current films are at best IPx4 compliant and only provide protection from splashing of water.

In addition, current films often result in treatment-induced high impedance, open circuit or intermittent function of movable electrical contacts. These treatment-induced issues may result in component and system level functional failure of the electronic device (often termed "out of box failures.") The root cause of these failures is contamination of the electrical contact zone from the films. These problems occur especially when the film thickness becomes greater than 500 nm (0.5 µm) and when large molecular weight films are used, such as parylene and cross-linked fluoroacrylates.

SUMMARY

In a first aspect, the present invention is a polysiloxane film comprising Si—O bonds and having a thickness of 0.3 to 1.5 microns. The polysiloxane film passes the corrosion current test and passes the contact resistance test.

In a second aspect, the present invention is a polysiloxane film formed by polymerizing monomers comprising at least one siloxane monomer having the formula $(X1)_n Si(R1)_{4-n}$, wherein n is 1, 2 or 3; $(X1)Si(R1)_2OSi(R1)_2(X1)$; $(X1)(Si(R1)_2O)_2Si(R1)_2(X1)$; and $[OSi(R1)_2]_m$, wherein m is 3 or 4. X1 is Cl or OR2. R2 is alkyl. Each R1 is independently selected from the group consisting of amino, hydroxyl, mercapto, alkoxy, alkyl, cycloalkyl, aryl and heteroaryl. The polysiloxane film contains Si—O bonds, has a thickness of 0.3 to 1.5 microns, passes the corrosion current test and passes the contact resistance test.

In a third aspect, the present invention is a method of forming a polysiloxane film comprising polymerizing monomers comprising at least one siloxane monomer having the formula $(X1)_nSi(R1)_{4-n}$, wherein n is 1, 2 or 3; $(X1)Si(R1)_2OSi(R1)_2(X1)$; $(X1)(Si(R1)_2O)_2Si(R1)_2(X1)$; and $[OSi(R1)_2]_m$, wherein m is 3 or 4. X1 is Cl or OR2. R2 is alkyl. Each R1 is independently selected from the group consisting of amino, hydroxyl, mercapto, alkoxy, alkyl, cycloalkyl, aryl and heteroaryl. The polysiloxane film contains Si—O bonds, has a thickness of 0.3 to 1.5 microns, passes the corrosion current test and passes the contact resistance test.

In a fourth aspect, the present invention is a method of forming a polysiloxane film in a reaction chamber comprising polymerizing monomers comprising at least one siloxane monomer having the formula $(X1)_nSi(R1)_{4-n}$, wherein n is 1, 2 or 3; $(X1)Si(R1)_2OSi(R1)_2(X1)$; $(X1)(Si(R1)_2O)_2Si(R1)_2(X1)$; and $[OSi(R1)_2]_m$, wherein m is 3 or 4. The polymerization is catalyzed by a 30-60 W radio frequency plasma. The pressure in the reaction chamber during the polymerization is 100-400 mTorr. X1 is Cl or OR2. R2 is alkyl. Each R1 is independently selected from the group consisting of amino, hydroxyl, mercapto, alkoxy, alkyl, cycloalkyl, aryl and heteroaryl. The polysiloxane film contains Si—O bonds and has a thickness of 0.3 to 1.5 microns.

In a fifth aspect, the present invention is an electronic device comprising electrical components coated with a polysiloxane film.

Definitions

The term "hydrophobic" refers to a film that includes fluorine.

The term "lipophilic" refers to a film that does not include fluorine.

"Alkyl" (or alkyl- or alk-) refers to a substituted or unsubstituted, straight or branched, hydrocarbon chain, preferably containing from 1 to 22 carbon atoms. More preferred alkyl groups are lower alkyl groups, for example, alkyl groups containing from 1 to 10 carbon atoms. Examples of suitable alkyl groups include methyl, ethyl, propyl, butyl, hexyl, octyl, decyldodecyl, octadecyl, and glycidoxypropyl groups.

"Cycloalkyl" refers to a substituted or unsubstituted cyclic hydrocarbon chain, preferably containing 3 to 22 carbon atoms. Preferred cycloalkyls have 3 to 10, preferably 3-6, carbon atoms in their ring structure. Examples of suitable cycloalkyl groups include cyclopropyl, cyclobutyl, cyclopentyl and cyclohexyl groups.

"Alkoxy" (or alkoxy- or alkox-) refers to a substituted or unsubstituted, straight or branched, hydrocarbon chain bonded to an oxygen atom, preferably containing from 1 to 22 carbon atoms. More preferred alkoxy groups are lower alkoxy groups, for example, alkoxy groups containing from 1 to 10 carbon atoms. Examples of suitable alkoxy groups include methoxy, ethoxy and butoxy groups.

"Aryl" refers to any aromatic carbocyclic group, preferably having 3 to 10 carbon atoms. The aryl group may be cyclic (such as phenyl (Ph)) or polycyclic (such as naphthyl), and may be unsubstituted or substituted. Preferred aryl groups include phenyl and naphthyl.

"Heteroaryl" refers to any heteroaromatic group, preferably having 3 to 10 carbon atoms. The heteroaryl group may be cyclic (such as pyridyl) or polycyclic (such as indolyl), and may be unsubstituted or substituted. Preferred heteroaryl groups include furyl, thienyl, pyridyl, indolyl, quinolinyl or isoquinolinyl.

"Substituted" means that the group contains at least one, preferably 1-3 substituent(s). Suitable substituents include alkyl, cycloalky, aryl, heteroaryl, amino, hydroxyl, mercapto, alkoxy, a carboxylic acid, phenethyl, a phosphonic acid, a sulfonic acid, a carboxylic ester, a carboxylic amide, a carboxylic anhydride, a saccharide, or a halogen.

"Energy Pooling" refers to molecules absorbing energy from more energetic species whereby the absorbed energy becomes localized in the weakest bond within a molecule causing this bond to break creating molecular fragments, which may be reactive in a specific environment.

"Saturated" refers to a compound with no carbon-carbon double or triple bonds.

The "corrosion current test" measures the leakage current (mA) of an electrode at a given voltage (DC) after water contact. If the electrodes are coated with a protective film, the corrosion current test indicates how much the film protects the electrode from water damage. The "corrosion current test" applies an electrical potential difference of 0 to 10 V between adjacent electrodes, covers the electrodes with a water drop, and measures the leakage current at specific voltages between 0-10 V using a Multimeter, such as the FLUKE true RMS Multimeter. The evolution of bubbles indicates corrosion occurs. For example, the leakage current may be measured at 0 V, 2 V, 4 V, 6 V, 8 V and 10 V. A low leakage current indicates a protective film provides good corrosion resistance by preventing water contact and ion conduction. Conversely, a high leakage current indicates a protective film provides poor corrosion resistance and allows water contact and ion conduction. A polysiloxane film is considered to pass the corrosion current test if adjacent electrodes coated with the film have a leakage current of at most 0.01 mA at 10 V under the "corrosion current test." Preferably, adjacent electrodes coated with a polysiloxane film have a leakage current of at most 0.005 mA at 10 V under the "corrosion current test."

The "contact resistance test" measures the resistance of a protective film to electrical contact. The "contact resistance" test is performed by compressing a film with a pogo pin and measuring the electrical resistance of the film. The pogo pin is 900 microns in diameter and has a contact area of 100 microns in diameter. The pogo pin may be attached to the vertical translator of a device such as the MTS INSIGHT electromechanical instrument. Compression of the film by the pogo pin, the normal force load, and the electrical resistance of the film are measured to determine resistance of the film to electrical contact at room-temperature conditions. An electrode coated with a polysiloxane film should have a contact resistance at least 10 times higher than an otherwise identical uncoated electrode. A polysiloxane film is considered to pass the contact resistance test if an electrode coated with the film has a contact resistance of at least 0.01 ohms at 1.0 mm of pogo pin compression under a 1.0 N load. Preferably, the contact resistance is infinite at 1.0 mm of pogo pin compression under 1.0 N load.

BRIEF DESCRIPTION OF THE DRAWINGS

The invention can be better understood with reference to the following drawings and description.

DETAILED DESCRIPTION

Figure 1:
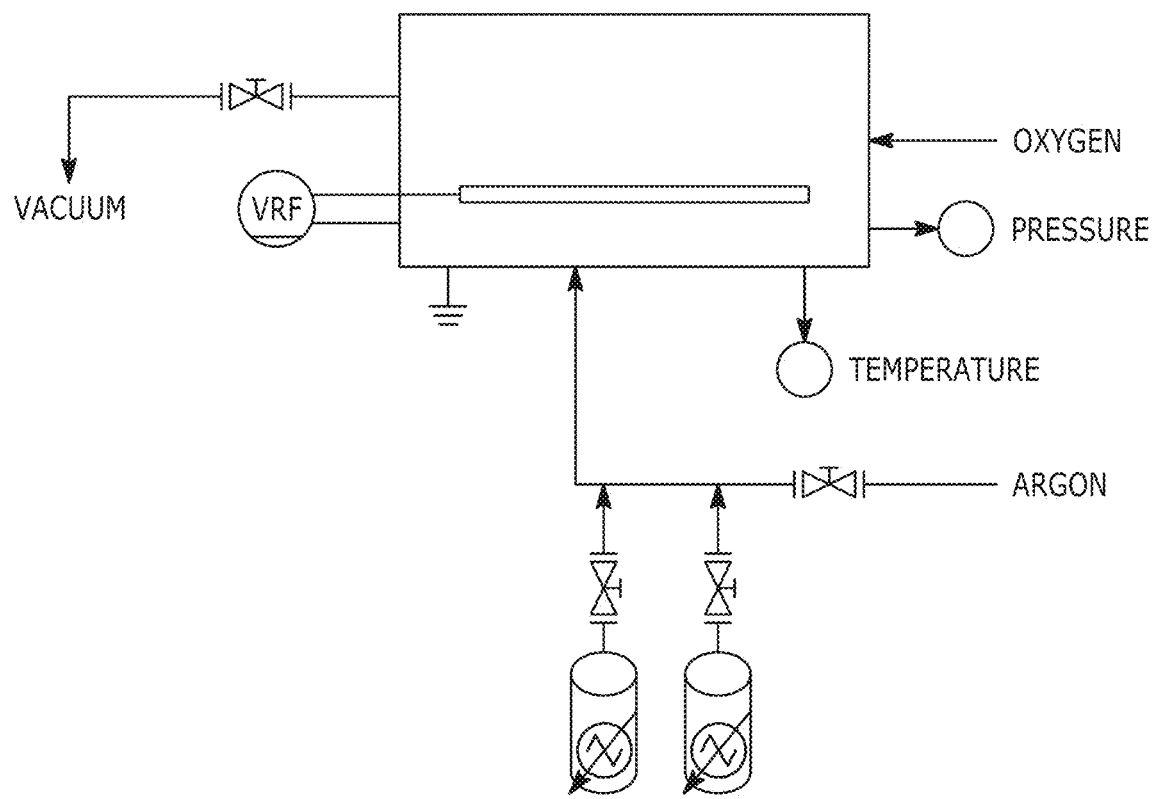
FIG. 1 illustrates a schematic of a plasma-enhanced chemical vapor deposition system.

An electronic device coated with a protective film should be able to be exposed to water, preferably submerged in water, while having voltage applied to all relevant circuits as if it were in use. The electronic device should be able to be exposed to an applied external charging voltage after exposure and still be functional until the device dries out completely. The electronic device should also show no visible signs of corrosion when inspected after exposure to water.

The present invention is a polysiloxane film that provides better water resistance than existing films to mechanically, electrically, and/or chemically protect electronic components attached to substrates in electronic devices. The polysiloxane film may contain fluorine, may completely cover the active electronic features on the surface being coated, and may prevent ion conduction. The film may be formed from monomers that are capable of wetting the surface to be coated and presenting reactive groups to form pendant grafts. The graft segments are rich in 7-electrons, which form an electron cloud that may prevent ion transport and may hinder corrosion while still allowing electrical contact between connector electrodes. The films may be pinhole free while retaining a degree of mechanical compliance. The monomers may be capable of diffusing into highly reticulated volumes found in substrate assemblies and wetting the electronic components on the substrate. The polysiloxane film may provide up to IPx7 protection from ingress of water.

The present invention also includes a method of preparing a polysiloxane film. The film may be formed by vapor phase polymerization in a plasma-enhanced chemical vapor deposition process. Plasmas that catalyze the surface-treatment reaction may be selected to create specific molecular fragments which further are film monomers. Heterogeneous plasma-polymerized film morphology may be controlled by the monomer mixture, the power of the applied plasma, the temperature of the gases used to form the plasma, and other operational parameters. The least stable bonds in the monomers are believed to be broken by energy pooling. Multi-layered and multi-compositional films are possible.

Polysiloxane films may be formed by polymerizing monomers comprising siloxane monomers, preferably linear or cyclic siloxane monomers. Especially preferred linear siloxane monomers may have the formula $(X1)_n Si(R1)_{4-n}$ in which n is 1, 2 or 3, (preferably, n is 2 or 3); $(X1)Si(R1)_2 OSi(R1)_2(X1)$; or $(X1)(Si(R1)_2 O)_2 Si(R1)_2(X1)$. Also especially preferred cyclic siloxane monomers may have the formula $[OSi(R1)_2]_m$, wherein m is 3 or 4. X1 may be a chemical leaving group comprised of chloro (Cl) or OR2. The side chains may be hydrophilic and/or lipophilic, and are selected to impart specific protective properties to the polysiloxane film. The chloro or OR2 groups are hydrolyzable to form unstable silanol groups, which may condense to form a polysiloxane backbone, and may optionally be covalently bonded on or around a surface being coated.

Polysiloxane films prepared by polymerizing monomers comprising one or more of the especially preferred siloxane monomers may form films which pass the contact resistance test and the corrosion current test.

Each R1 may independently be selected from the group consisting of amino, hydroxyl, mercapto, alkoxy, alkyl, cycloalkyl, aryl and heteroaryl. If R1 is alkyl, cycloalkyl, or heteroaryl, it may be substituted or unsubstituted. Suitable substituents include alkyl, cycloalky, aryl, heteroaryl, amino, hydroxyl, mercapto, alkoxy, a carboxylic acid, phenethyl, a phosphonic acid, a sulfonic acid, a carboxylic ester, a carboxylic amide, a carboxylic anhydride, a saccharide, a halogen (such as F, Cl, and/or Br), or a salt of such groups that may be ionizable. A preferred substituent is fluorine (F). Each R1 may be the same, or may be different.

R2 may be an alkyl group. Preferably, R2 is an alkyl group containing 1-6 carbon atoms. Examples of especially preferred R2 groups are methyl and ethyl groups. Each R2 may be the same, or may be different.

Suitable monomers include phenethyltrimethoxysilane (PETMS), perfluorododecyltriethoxysilane (PFDTES), hexamethylcyclotrisiloxane (HMCTS), octamethylcyclotetrasiloxane, hexamethylcyclotrisilazane, octamethylcyclotetrasilazane, phenyltrimethoxysilane, diphenyldimethoxysilane, octyltrimethoxysilane, diphenyldiethoxysilane, pentafluorophenylpropyltrimethoxysilane (PFPPTMS), and combinations thereof. Preferred monomers include phenethyltrimethoxysilane (PETMS), perfluorododecyltriethoxysilane (PFDTES), hexamethylcyclotrisiloxane (HMCTS), and combinations thereof.

It is believed that the polysiloxane film polymerizes through one or more trialkoxysilyl groups attached to the end of film chains. The trialkoxysilyl groups are likely displaced by a hydroxyl group on or around the electronic components being treated, forming silicon-to-oxygen bonds that mechanically anchor the film to the electrical component. The film does not need to be covalently bonded to the surface being coated. Bonding is likely achieved by reacting with di-functional coupling agents composed of hydrocarbon chains or polyoxyalkylene chain groups.

The polysiloxane films may optionally be swollen with non-volatile diluents. The addition of non-volatile diluents enables connectors to operate within the contact range dictated by the electronic device, yet be sufficiently mechanically robust to be attached and removed without disrupting the film properties. The non-volatile diluent also imparts a special flex to the connector. Suitable non-volatile diluents include alkyl and aryl hydrocarbons having 4-9 carbon atoms.

The polysiloxane film may have a thickness of 0.1 to 10.0 µm, including 0.2 µm, 0.3 µm, 0.4 µm, 0.5 µm, 0.6 µm, 0.7 µm, 0.8 µm, 0.9 µm, 1.0 µm, 1.1 µm, 1.2 µm, 1.3 µm, 1.4 µm, 1.5 µm, 1.6 µm, 1.7 µm, 1.8 µm, 1.9 µm, 2.1 µm, 2.2 µm, 2.3 µm, 2.4 µm, 2.5 µm, 3.0 µm, 3.5 µm, 4.0 µm, 4.5 µm, 5.0 µm, 5.5 µm, 6.0 µm, 7.0 µm, 7.5 µm, 8.0 µm, 9.0 µm and 9.5 µm. Preferably, the thickness is 0.3 to 1.5 µm. More preferably, the thickness is 0.5 to 1.1 µm. Under the conditions tested, films with thicknesses above 1.1 µm are typically soft and friable, and flake when subjected to mild levels of mechanical shear. However different conditions may produce dense films, which become thicker than 1.1 µm and are mechanically robust.

The polysiloxane film may be characterized by scanning electron microscopy (SEM). The resulting micrographs may show polysiloxane film appearances ranging from rough and highly textured, to smooth with even surfaces. Polysiloxane films with a smooth, even surface appear to be dense, and may indicate the electronic component is unable to make electrical contact with other electronic components. It is believed that rough areas of a polysiloxane film are less dense and provide areas, which may make electrical contact with other electronic components. Selecting monomers and/or processing conditions to tailor the density of the polysiloxane film also determines film surface roughness and controls the formation of deposits on the film, such as carbon deposits.

Figure 5:
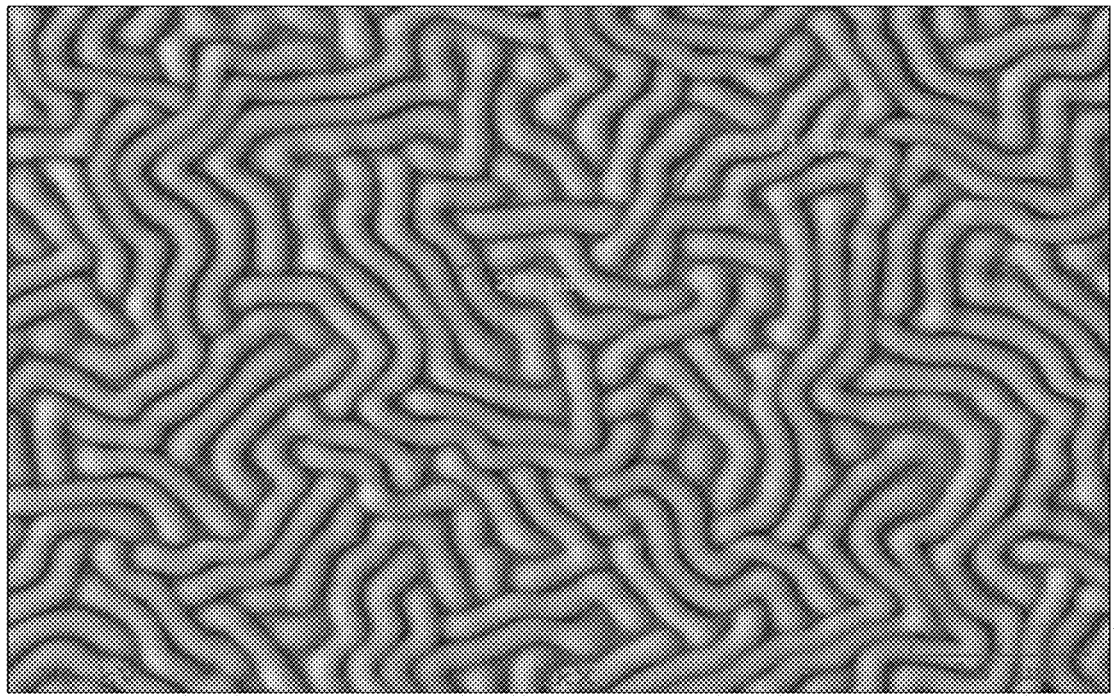
FIG. 5 illustrates a scanning electron microscopy (SEM) micrograph of a component coated with a polysiloxane film.

The polysiloxane film may form contoured regions on the surface being coated. The contoured regions may be visible under SEM, as in FIG. 5. The contoured regions may have a width from 0.1-3.0 µm. Preferably, the width of the contoured regions is 0.5-1.5 µm, including 0.6 µm, 0.7 µm, 0.8 µm, 0.9 µm, 1.0 µm, 1.1 µm, 1.2 µm, 1.3 µm and 1.4 µm. The contoured regions may have a length that is at least five times greater than their width. Preferably, the contoured regions may have a length that is at least six times greater than their width, at least seven times greater than their width, or at least 8 times greater than their width. For example, if the width is 1.3 µm, the length may be at least 6.5 µm, at least 7.8 µm, at least 9.1 µm, or at least 10.4 µm.

The polysiloxane film may be applied to a surface being coated using plasma-enhanced chemical vapor deposition (PECVD). FIG. 1 illustrates a schematic of a PECVD system. A typical vacuum plasma system has three modules: a rectangular reaction chamber, which may measure 12.5-in (W)×9.6-in (D)×10-in (H) and may be constructed of 6061 aluminum; a process controller module; and a solid-state radio frequency (RF) power generator. Preferably, the reaction chamber is grounded. The reaction chamber may be front-loaded and equipped with movable shelves for loading and unloading electrical components. The movable shelves may be powered so that they may be mechanically adjusted. Preferably, the shelves are supported by ceramic pieces to electrically isolate them from the reaction chamber. The reaction chamber may have an access door equipped with a viewing window for observing the UV-visible spectra of the plasma via an optical fiber. The process controller monitors and regulates the plasma process parameters, including chamber base pressure, RF power level, process duration, and gas flow rates. The RF generator may have a fixed frequency, such as 13.56 MHz, or may be adjustable. Impedance matching may be achieved by employing an inductive-capacitive tuning network to adjust the forward power to reflected power ratio during processing to achieve good power transfer to the plasma. The RF generator power level may be controlled and monitored by a technician using the device. Other suitable application methods include thermal vapor phase polymerization, plasma-assisted aerosol deposition and plasma-based ion implantation.

Figure 2:
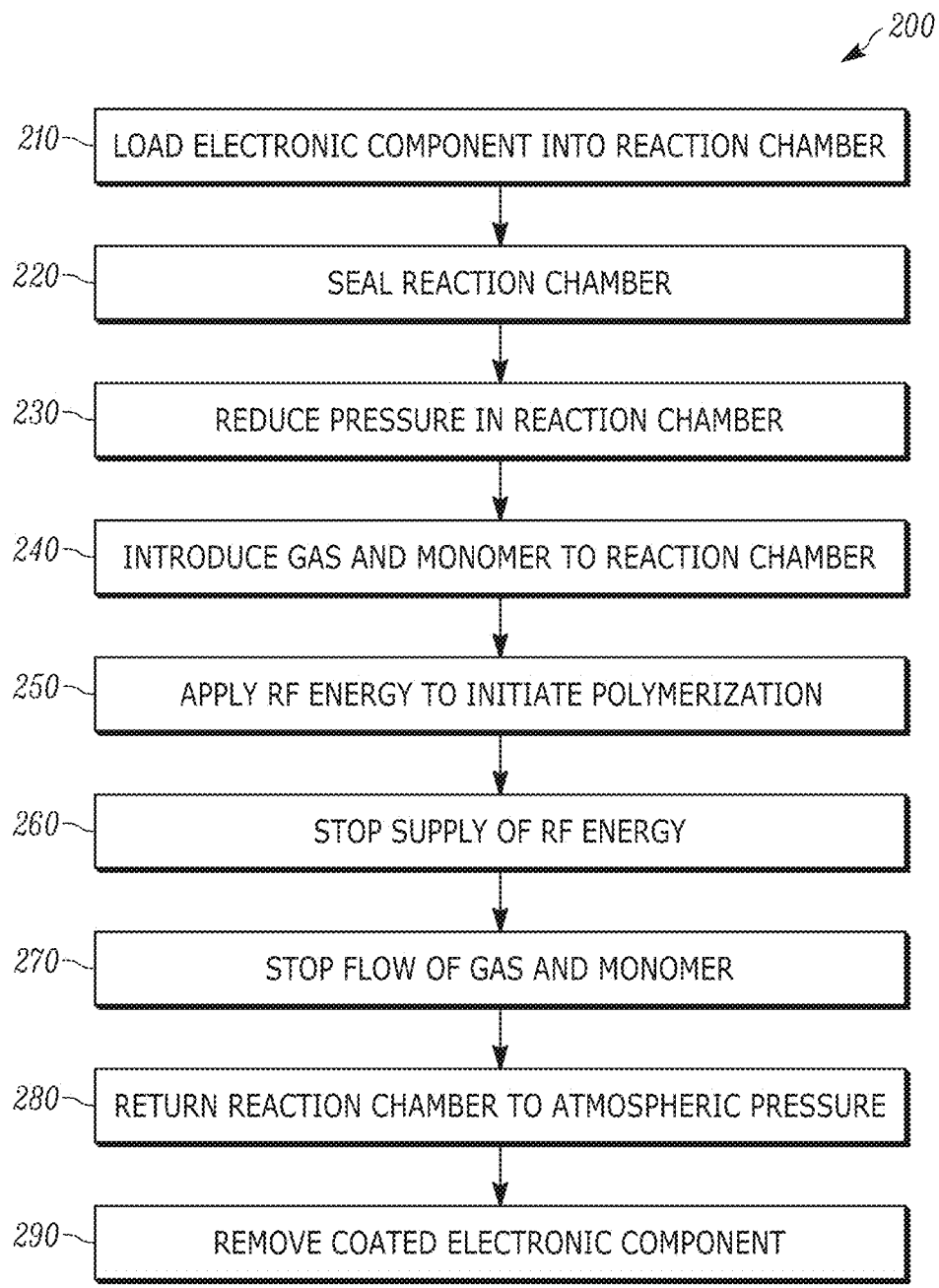
FIG. 2 illustrates a method for applying a film to an electronic component on a substrate.

FIG. 2 illustrates a method 200 for applying a polysiloxane film to an electronic component on a substrate. First, the electronic component to be coated is loaded into a reaction chamber at 210. The reaction chamber is then sealed at 220. After the reaction chamber has been sealed, the pressure in the reaction chamber is reduced to a preset vacuum level at 230. Next, a gas that includes a monomer, or a plurality of monomers, is introduced into the reaction chamber at 240. Once the gas has been introduced to the chamber, RF energy is applied to the reaction chamber to create a plasma and initiate heterogeneous gas-phase polymerization at 250. Polymerization is stopped by ending the supply of RF energy to the reaction chamber at 260. Next, the flow of gas to the reaction chamber is stopped at 270. The chamber is then returned to atmospheric pressure at 280. The component with the polysiloxane film coating is then removed from the reaction chamber at 290. The polysiloxane film may optionally be swollen with a non-volatile diluent.

Preferably, the polymerization is stopped by ending the supply of RF energy to the reaction chamber at a point just before the plasma is quenched. Quenching may be determined by monitoring the UV-visible spectrum of the plasma. A decrease in the UV-visible spectrum is an indication that the plasma is nearly quenched and that the polymerization should be stopped.

Suitable gases include inert gases such as argon, nitrogen, helium, and mixtures thereof. Preferably, the gas is argon.

The gas may optionally include substances that promote polymer cross-linking. Examples of suitable substances include oxygen ($O_2$ and $O_3$), nitrous oxide ($N_2O$), carbon dioxide ($CO_2$), water, other oxygen-containing compounds, and mixtures thereof.

The amount of RF energy applied to the reaction chamber may be 30 to 60 W, including 35 W, 36 W, 37 W, 38 W, 39 W, 40 W, 41 W, 42 W, 43 W, 44 W, 45 W, 46 W, 47 W, 48 W, 49 W, 50 W, 51 W, 52 W, 53 W, 54 W and 55 W. Preferably, the RF energy is from 35 to 45 W. Varying the RF energy will remove or preserve OR2 groups in the monomer. For example, some alkoxy groups are retained at 30 W while most alkoxy groups are removed at 40 W. Use of lower amounts of RF energy may require an increase in reaction time to fully apply a polysiloxane film. Use of higher amounts of RF energy may result in the formation of unwanted side products.

The pressure in the reaction chamber may range from 100-400 mTorr, including 125 mTorr, 150 mTorr, 175 mTorr, 200 mTorr, 225 mTorr, 250 mTorr, 275 mTorr, 300 mTorr, 325 mTorr, 350 mTorr and 375 mTorr. Preferably, the pressure is 150-325 mTorr. More preferably, the pressure is 175-250 mTorr.

The monomer may be heated to 30-200° C., including 40° C., 50° C., 60° C., 70° C., 80° C., 90° C., 100° C., 110° C., 120° C., 130° C., 140° C., 150° C., 160° C., 170° C., 180° C. and 190° C. Preferably, the monomer is heated to 40-170° C. More preferably, the monomer is heated to 75-140° C. Other temperatures may be selected based on the vapor pressure of the monomer and amount desired.

The polymerization may be carried out at a temperature of 30-100° C., including 35° C., 40° C., 45° C., 50° C., 55° C., 60° C., 65° C., 70° C., 75° C., 80° C., 85° C., 90° C. and 95° C. Preferably, the temperature is 40-80° C.

The residence time of the monomer in the reaction chamber impacts the physical characteristics of the polysiloxane film. Decreasing the residence time in the reaction chamber produces a higher gas turnover rate, which increases the growth rate of the polysiloxane film. Increasing the residence time in the reaction chamber produces thinner, denser films. The residence time of the monomer in the reaction chamber may be 5-120 minutes, including 5 minutes, 10 minutes, 20 minutes, 30 minutes, 40 minutes, 50 minutes, 60 minutes, 70 minutes, 80 minutes, 90 minutes, 100 minutes and 110 minutes. Preferably, the residence time of the monomer in the reaction chamber is 5-60 minutes.

Varying the parameters of the polymerization process allows for the characteristics of the polysiloxane film to be tailored to provide a desired protection. For example, polymerizing a hexamethylcyclotrisiloxane (HMCTS) monomer heated to 75° C. in argon at a pressure of 310 mTorr with 40 W RF energy creates a 1.4 µm thick polysiloxane film. Similarly, polymerizing a hexamethylcyclotrisiloxane (HMCTS) monomer heated to 120° C. in argon at a pressure of 310 mTorr with 30 W RF energy creates a 1.0 µm thick polysiloxane film with carbon-rich deposits.

The polysiloxane film may be applied to electronic components attached to a variety of substrates. For example, the substrate may be a ceramic substrate, a glass substrate, a silicone substrate, a polyimide substrate, a PCB or any other substrate used for attaching integrated circuits. External surfaces may also be coated by the film. The coated items may be used in portable electronic devices such as smart phones, media players, tablet computers, laptop computers and the like, including exterior surfaces and accessories for such devices.

The polysiloxane film may be applied to electronic devices in various stages of assembly. For example, individual electronic components of an electronic device may be coated with a film prior to being assembled. Alternatively, the electronic device may be partially-assembled before being coated with a film. A fully-assembled electronic device may also be coated with a film, but applying a film at this stage of assembly may limit access to some electronic components of the device.

Multiple polysiloxane films may optionally be applied to an electronic component on a substrate. The same film may be applied multiple times to an electronic component, or different films may be applied to the electronic component. The films may be applied to the same location of the electronic component to provide a multi-layered film, or may be applied to different locations of the electronic component. The films may impart the same mechanical and chemical properties, or different mechanical and chemical properties. For example, a first polysiloxane film may be relatively hard, compliant, adhesion-promoting, or thermally conductive, and may be applied over one or more electronic components attached to a PCB. The second polysiloxane film may be relatively compliant, and may be applied between an electrical connector and the PCB to cover a plurality of leads which extend out of the connector and are electrically attached to bonding pads on the PCB.

EXAMPLES

Example 1

Deposition of Polymeric Films

The deposition of polymeric films onto substrate assemblies with argon plasmas at various process parameters was investigated. It was known that phenethyltrimethoxysilane (PETMS) and similar chemistries may react to form coatings via heterogeneous gas-phase polymerization with metal oxide surfaces at 125° C. to 200° C., depending on substrate chemistry, reaction environment, and catalyst. See, for example, U.S. Pat. No. 7,303,819 to Brotzman, Jr.; U.S. Pat. No. 7,182,938 to Andre et al.; U.S. Pat. No. 5,993,967 to Brotzman, Jr. et al., and U.S. Pat. No. 6,033,781 to Brotzman, Jr. et al.

Figure 3:
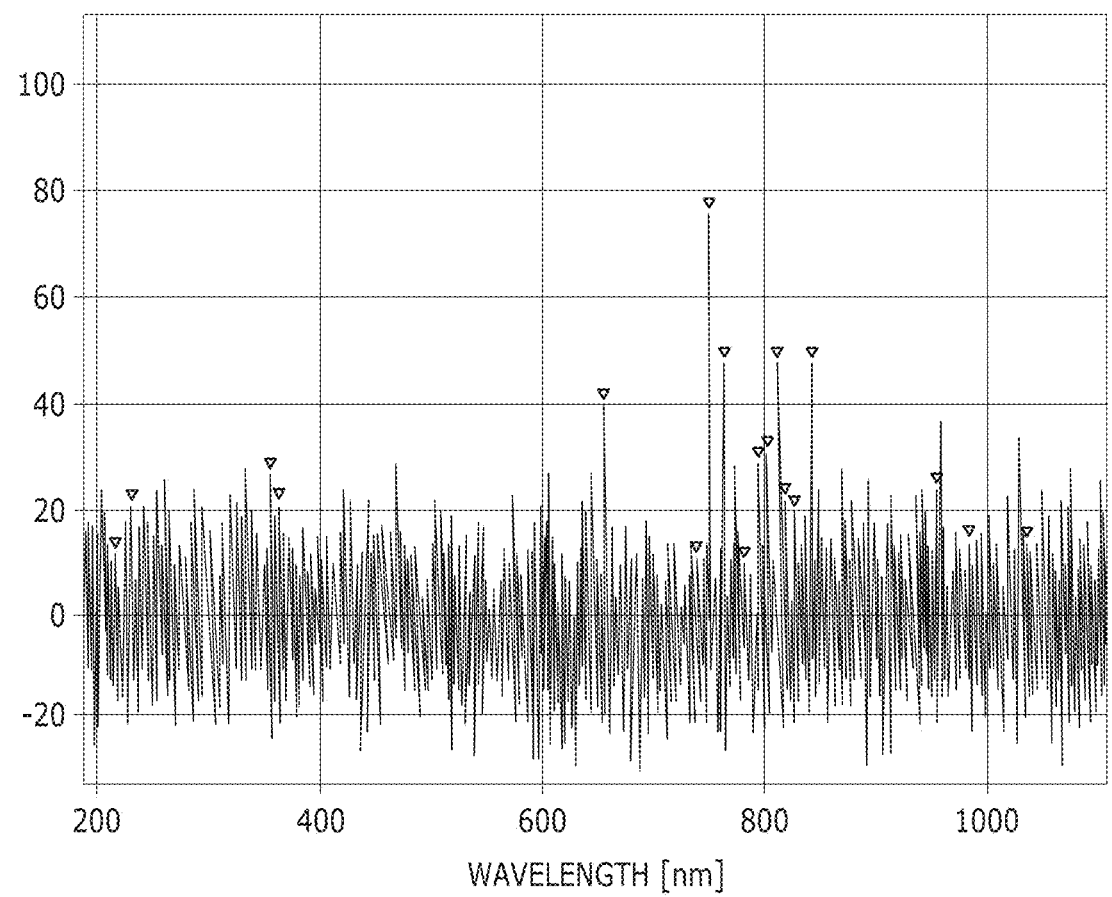
FIG. 3 illustrates the UV-visible spectra of a 40 W argon plasma.

In a first experiment, a substrate assembly was treated with an argon plasma that contained no monomers. The argon plasma was initiated and maintained by an RF generator at 40 W power at process temperature of 40° C. FIG. 3 illustrates the UV-visible spectra of the plasma (specific argon peaks are marked). No polysiloxane film was formed on the substrate assembly. This process was capable of cleaning the substrate assembly, if the plasma treatment time was sufficient.

In a second experiment, a substrate assembly was treated with argon gas containing phenethyltrimethoxysilane (PETMS) without plasma (0 W power) at a process temperature of 40° C. No polysiloxane film was formed on the substrate assembly. This process was not capable of cleaning the substrate assembly.

Figure 4:
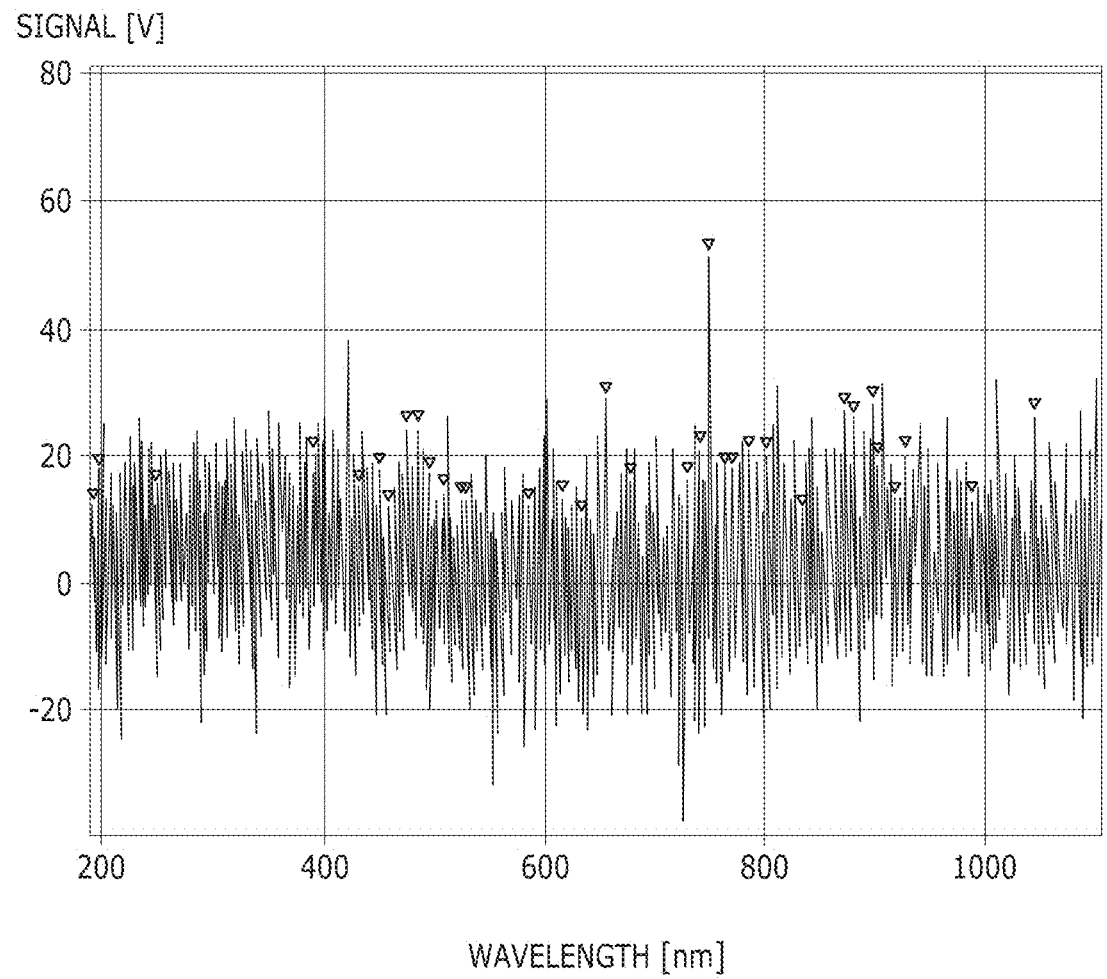
FIG. 4 illustrates the UV-visible spectra of a 40 W argon/phenethyltrimethoxysilane (PETMS) gas mixture plasma.

In a third experiment, a substrate assembly was treated with plasma of argon containing PETMS. The argon/PETMS plasma was initiated and maintained by an RF generator at 40 W power at a process temperature of 40° C. FIG. 4 illustrates the UV-visible spectra of the plasma (specific argon peaks are marked). A polysiloxane film was formed on the substrate assembly, as shown in the scanning electron microscopy (SEM) micrograph illustrated in FIG. 5. As visible in the image, the polysiloxane film contained contoured regions that were approximately 10.91 µm long and 1.29 µm wide.

These experiments demonstrate that an applied RF electric field of sufficient power is capable of exciting a gas containing a monomer and catalyzing the polymeric coating of a substrate assembly. It is believed that the polysiloxane film is formed by an energy pooling mechanism.

Example 2

Coating of PCBs

Figure 6:
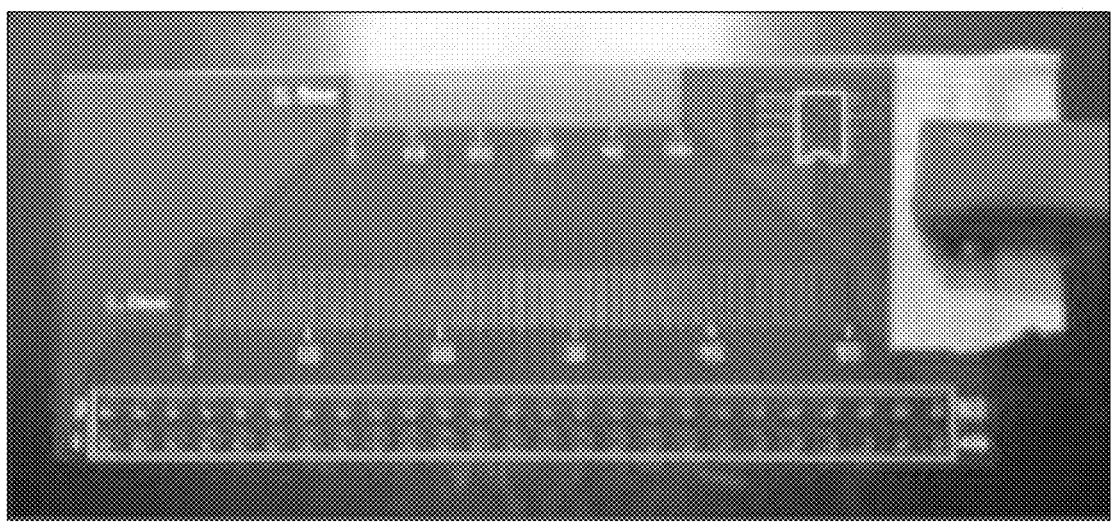
FIG. 6 illustrates a printed circuit board (PCB) with substrate assemblies including copper circuit traces from leads to rectangular test pads.

PCBs were coated with a polysiloxane film using the PECVD system described above and illustrated in FIG. 1. The PCBs had substrate assemblies including copper circuit traces from leads to rectangular test pads that were approximately 0.8 mm×4.5 mm, separated by 0.2 mm, as illustrated in FIG. 6. Argon was used as the gas. The monomer was heated to increase its vapor pressure and introduced into the argon flow. The reaction chamber had a pressure of approximately 350 mTorr to 50 mTorr against approximately a 10 mTorr vacuum. Plasma was initiated by RF electric field to catalyze a heterogeneous polymerization reaction to occur on or around the surface of the electrical components on the PCBs. The reaction products created a polysiloxane film on the electrical components attached to the PCB substrates.

Example 3

Corrosion Current Test (Comparative)

The corrosion current of electrodes coated with a commercially available fluorinated film was investigated. The PCB described in Example 2 was used as the substrate.

Figure 7:
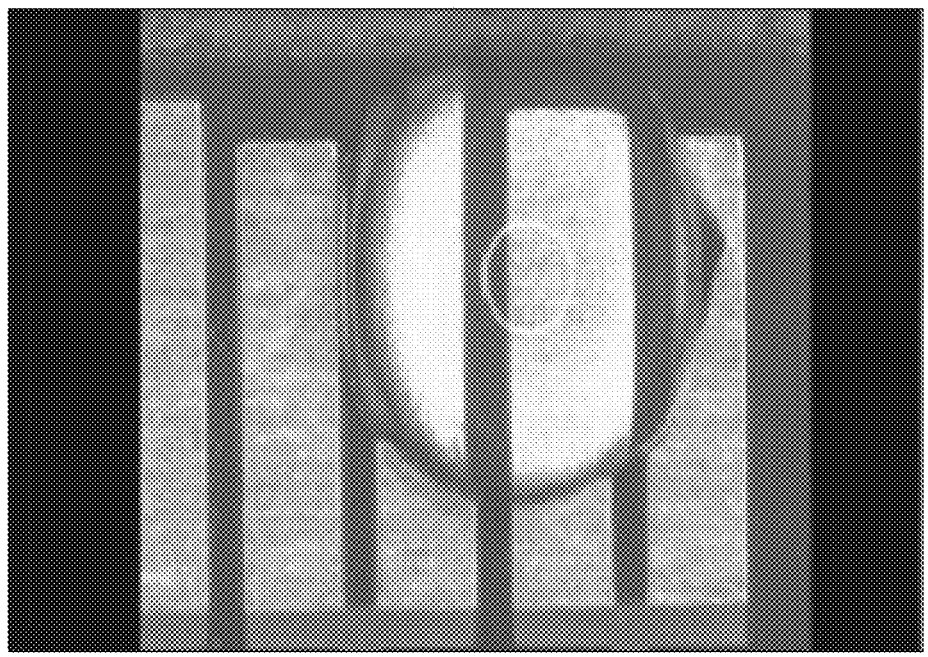
FIG. 7 illustrates a corrosion current experiment.
Figure 8:
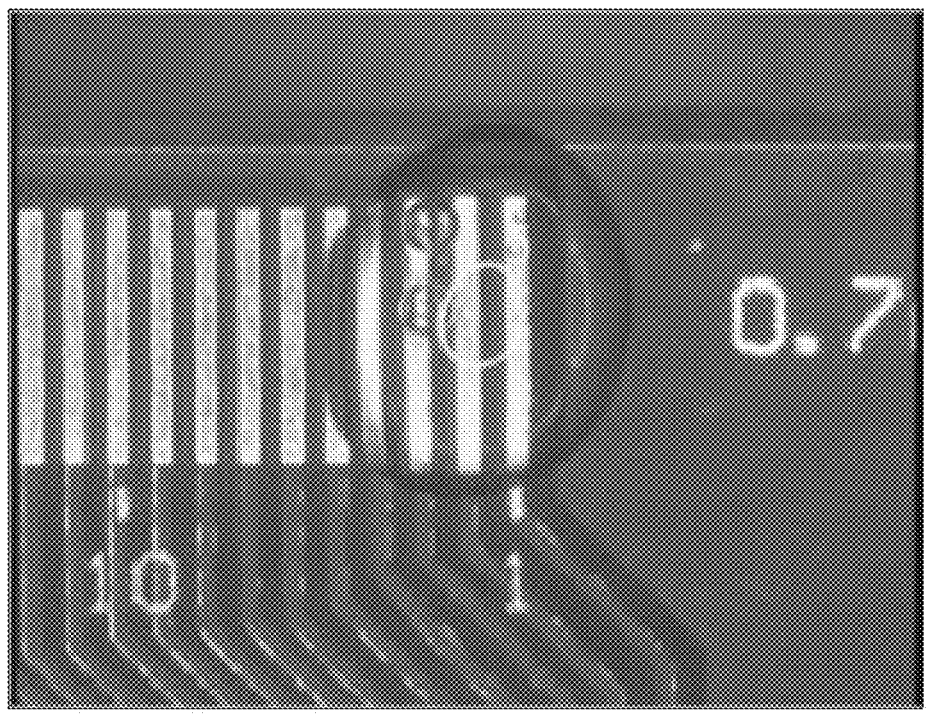
FIG. 8 illustrates bubbles formed during a corrosion current experiment.

Corrosion current was measured by covering adjacent electrodes with a water drop as illustrated in FIG. 7. Bubbles rapidly evolved when corrosion occurred, as illustrated in FIG. 8. Adjacent electrodes may have an applied electrical potential from 0 to 10 V. An applied electrical potential of 10 V was selected to demonstrate the efficacy of applied films.

The results of the corrosion current experiment are shown in Table 1 below:

TABLE 1

Corrosion current of commercially-available fluorinated film

| Voltage (dc) | Untreated PCB (mA) | PCB with 0.10 μm thick film (mA) |
| --- | --- | --- |
| 2 V | 0.005 | 0.001 |
| 4 V | 0.233 | 0.058 |
| 6 V | 0.522 | 0.263 |
| 8 V | 0.679 | 0.473 |
| 10 V | 0.758 | 0.652 |

The results show no significant difference between the current of the untreated PCB and the PCB with a 0.10 μm thick fluorinated film. The fluorinated film provided virtually no protection from water intrusion and ion mobility.

Example 4

Contact Resistance (Comparative)

The contact resistance of electrodes coated with a commercially available fluorinated film was investigated. The PCB described in Example 2 was used as the substrate.

Contact resistance, as a function of pin load, was measured by compression of a film by a pogo pin. The pogo pin was 900 microns in diameter and had a contact area of approximately 100 microns diameter. The pogo pin was attached to the vertical translator of an MTS INSIGHT electromechanical instrument. Compression of the film by the pogo pin, normal force load, and electrical resistance of the film were measured to determine resistance of the film to electrical contact at room-temperature conditions. Untreated electrodes and electrodes coated with a fluorinated film were tested for contact resistance.

Figure 9:
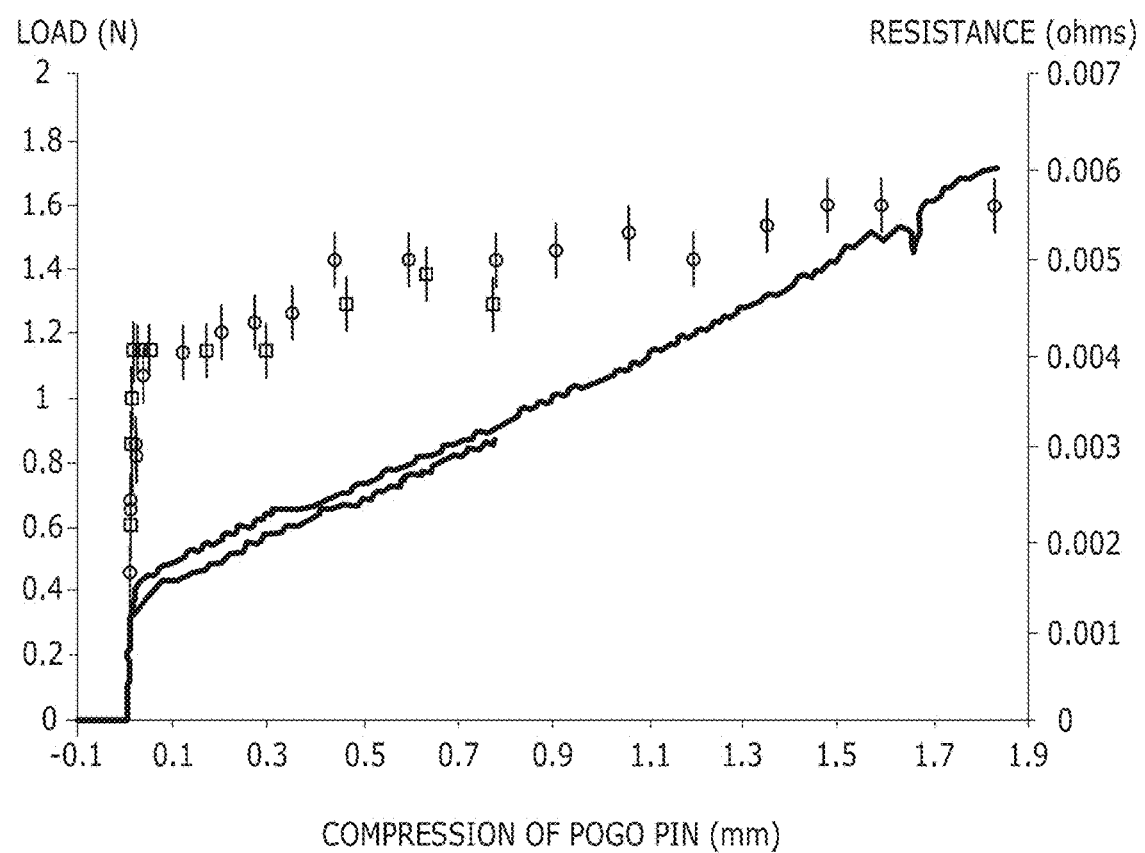
FIG. 9 illustrates a graph of contact resistance as a function of pogo pin load for untreated electrodes and electrodes coated with a fluorinated film. The left y-axis is the pogo pin load in N, and the right y-axis is measured electrical resistance of the film in ohms.

FIG. 9 illustrates a graph of contact resistance as a function of pogo pin load for untreated electrodes and electrodes coated with a fluorinated film. The light gray line shows the load as a function of pogo pin compression for the untreated electrodes. The diamond-shaped data points represent the contact resistance for the untreated electrode. The dark gray line shows the load as a function of pogo pin compression for the coated electrodes. The square-shaped data points represent the contact resistance for the coated electrodes. The graph shows no difference in contact resistance between the coated and uncoated electrodes. The fluorinated film provided virtually no protection from damage due to physical contact.

Example 5

Analysis of Polysiloxane Films

Figure 14:
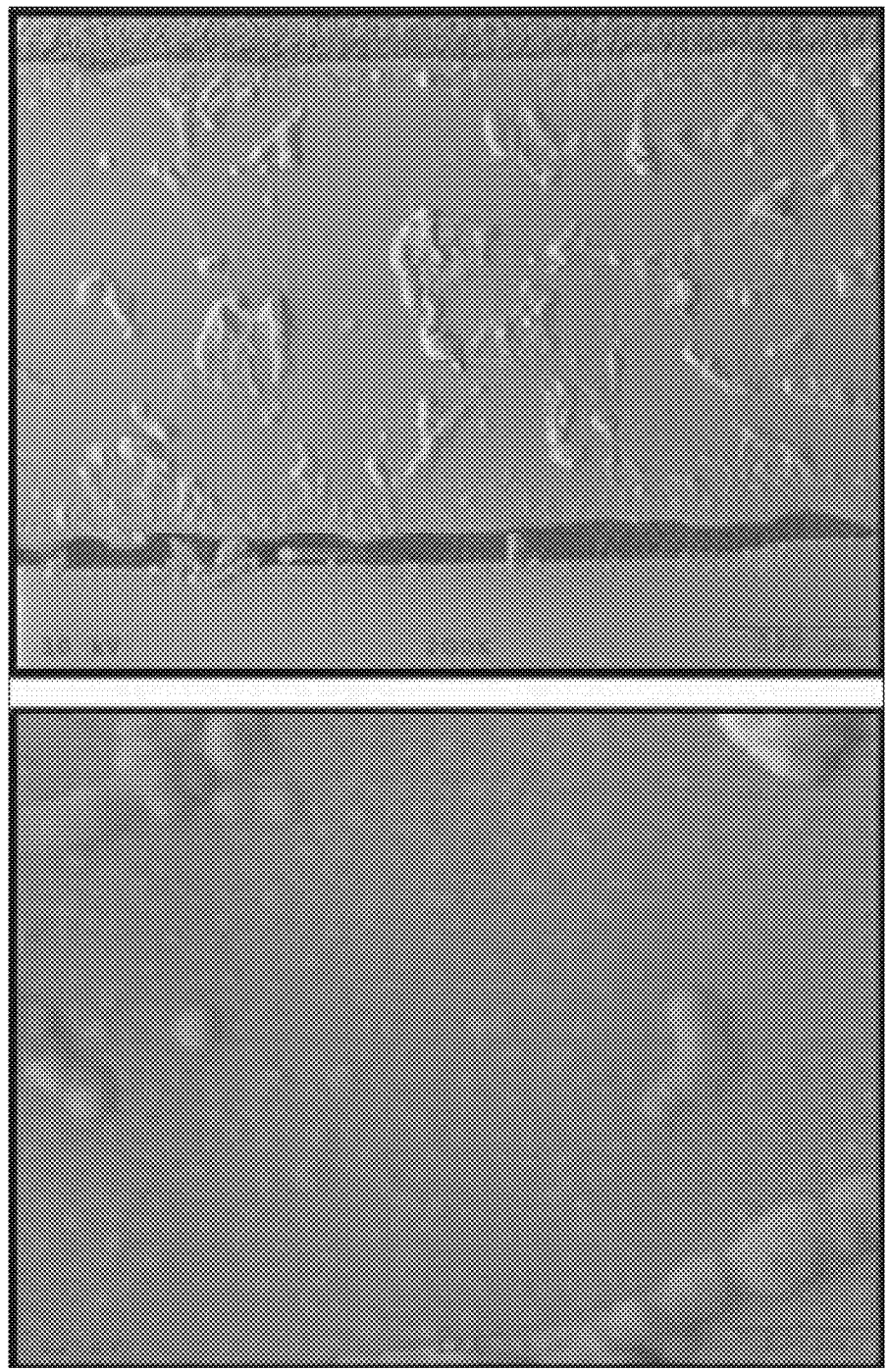
FIG. 14 illustrates two SEM micrographs of an electrode coated with a polymer formed from phenethyltrimethoxysilane (PETMS) and perfluorododecyltriethoxysilane (PFDTES) at two levels of magnification.

Seven polysiloxane films were prepared as follows:

Film A—The polysiloxane film included a first polymer layer formed from PETMS and a second polymer layer formed from a mixture of PETMS and perfluorododecyltriethoxysilane (PFDTES). This film was hydrophobic. The film layers were applied using process pressures of approximately 176 mTorr and 232 mTorr, respectively. The PETMS monomer was heated to 130° C., while the PFDTES monomer was headed to 140° C. The plasma power was 40 W and the total time of reaction was approximately 45 minutes. The composite PETMS/PFDTES film was 1.4 microns thick. FIG. 14 illustrates two SEM micrographs of the polymer formed from PETMS and PFDTES at two levels of magnification and shows the roughness of the film.

Figure 12:
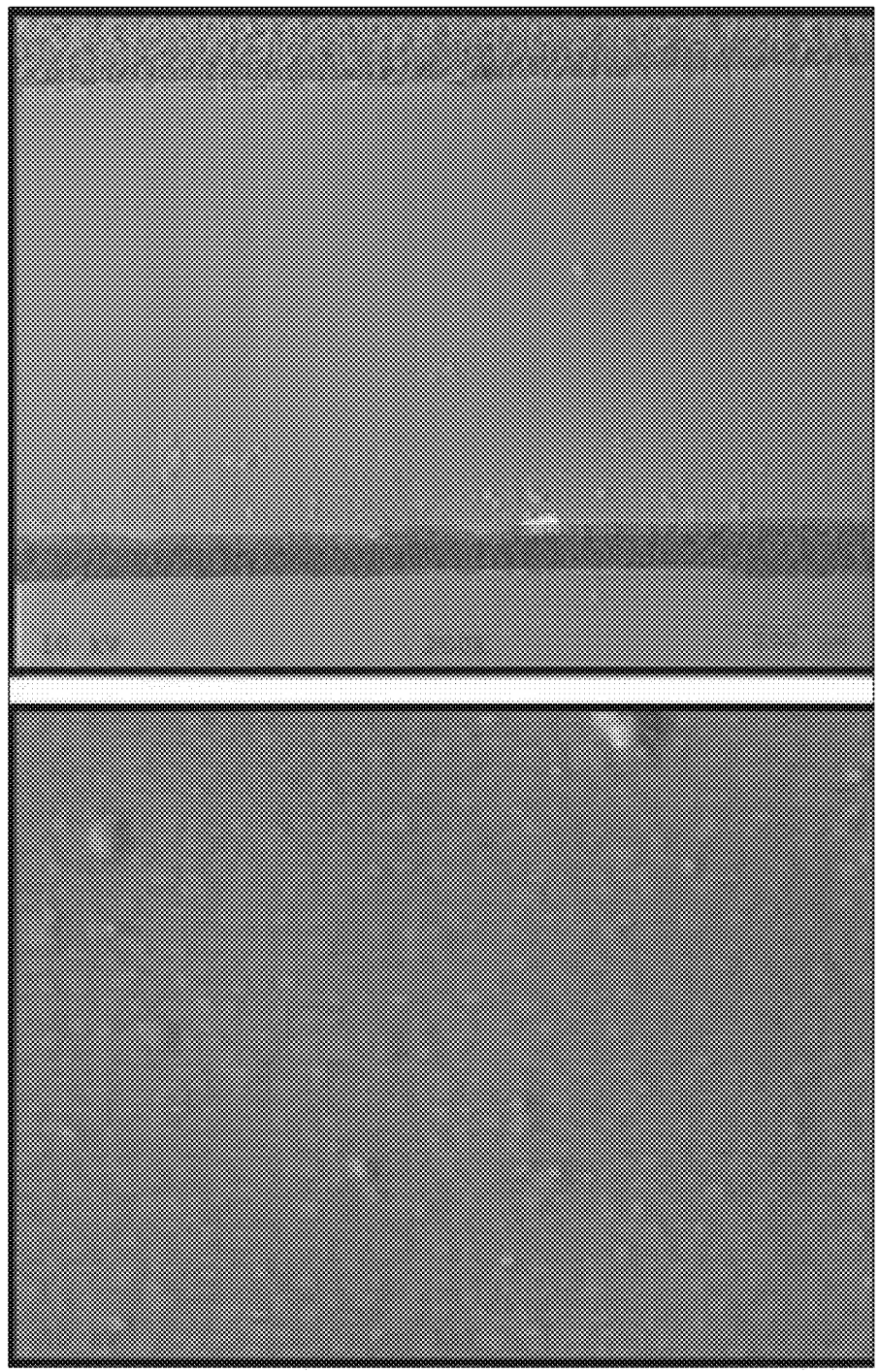
FIG. 12 illustrates two SEM micrographs of an electrode coated with a polymer formed from phenethyltrimethoxysilane (PETMS) at two levels of magnification.

Film B—The polysiloxane film was formed from PETMS. This film was lipophilic. The film was applied at a process pressure of approximately 217 mTorr. The PETMS monomer was heated to 130° C. The plasma power was 40 W and the time of reaction was approximately 40 minutes. The PETMS film was 1.4 microns thick. FIG. 12 illustrates two SEM micrographs of the polymer formed from PETMS at two levels of magnification and shows the roughness of the film.

Figure 13:
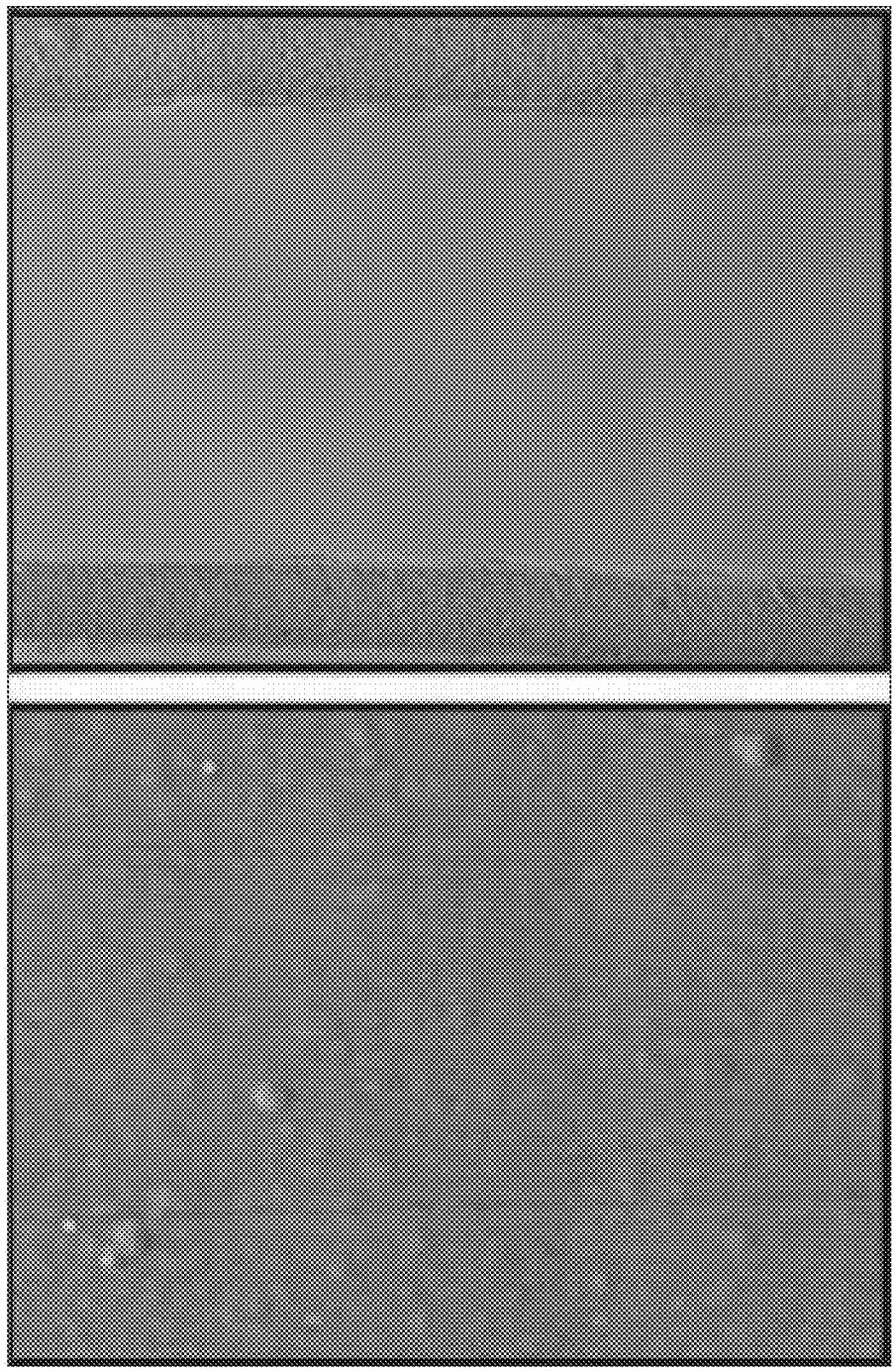
FIG. 13 illustrates two SEM micrographs of an electrode coated with a polymer formed from phenethyltrimethoxysilane (PETMS) at two levels of magnification.

Film C—The polysiloxane film was formed from PETMS. This film was lipophilic. The film was applied using a process pressure of 311 mTorr. The PETMS monomer was heated to 130° C. The plasma power was 40 W. The PETMS film was 1.1 microns thick. FIG. 13 illustrates two SEM micrographs of the polymer formed from HMCTS at two levels of magnification and shows the roughness of the film.

Figure 15:
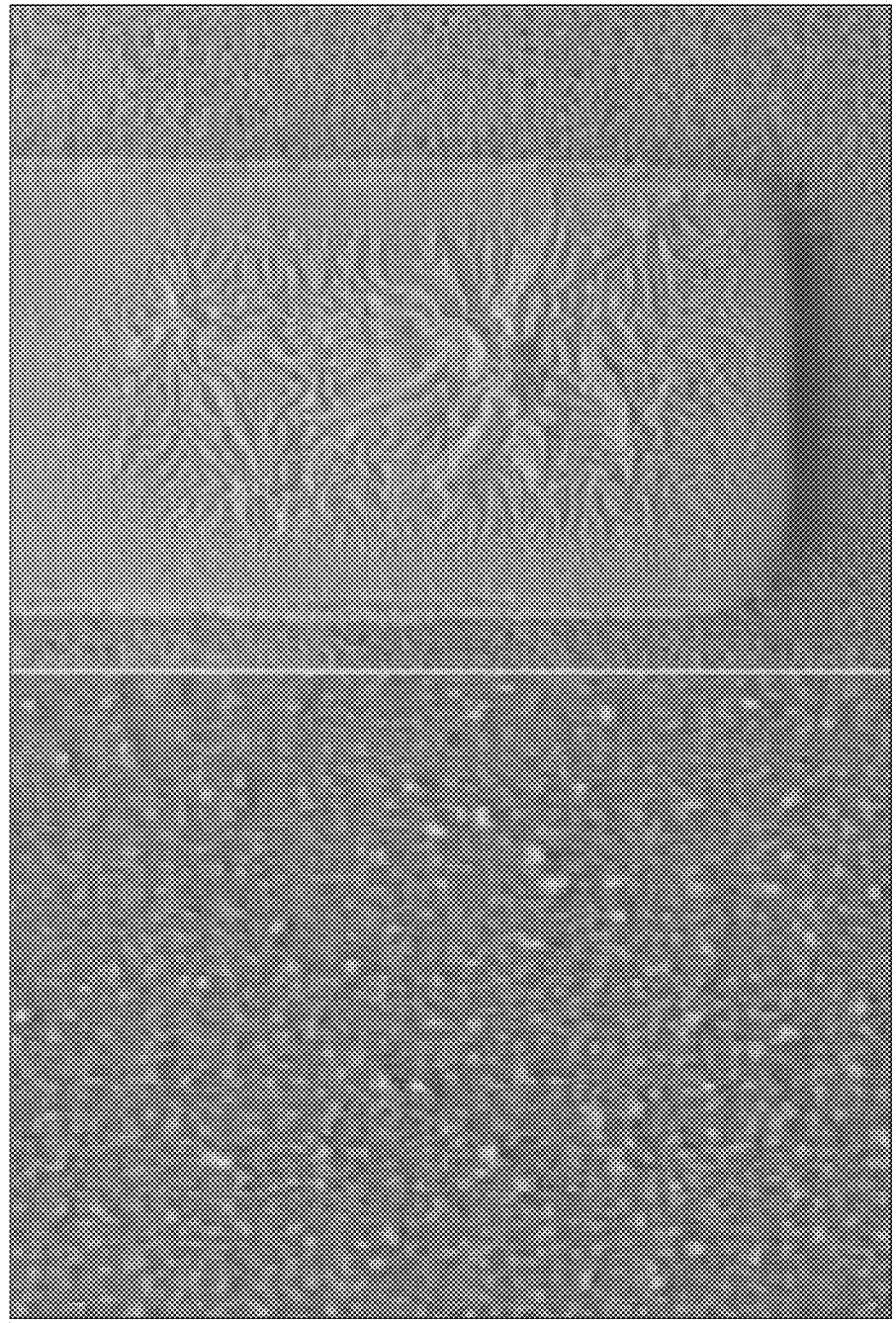
FIG. 15 illustrates two SEM micrographs of an electrode coated with a polymer formed from hexamethylcyclotrisiloxane (HMCTS) at two levels of magnification.

Film D—The polysiloxane film was formed from hexamethylcyclotrisiloxane (HMCTS). This film was applied using a process pressure of approximately 301 mTorr. The HMCTS monomer was heated to 75° C. The plasma power was 40 W. The HMCTS film was 1.4 microns thick. FIG. 15 illustrates two SEM micrographs of the polymer formed from HMCTS at two levels of magnification and shows the high degree of roughness of the film.

Figure 16:
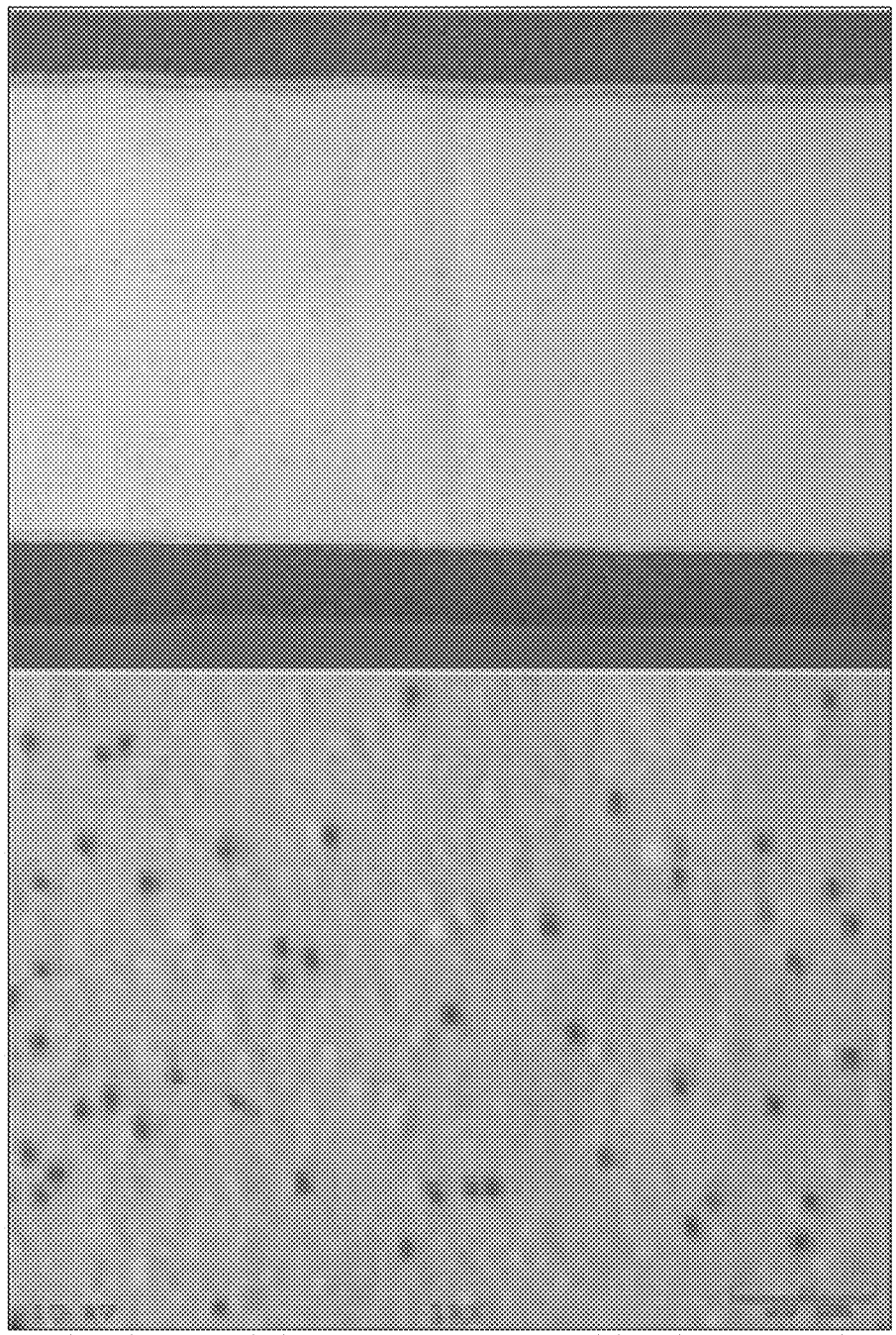
FIG. 16 illustrates two SEM micrographs of an electrode coated with a polymer formed from hexamethylcyclotrisiloxane (HMCTS) at two levels of magnification.

Film E—The polysiloxane film was formed from HMCTS. This film was applied using argon gas at a process pressure of approximately 308 mTorr. The HMCTS monomer was heated to 120° C. The plasma power was 30 W. The HMCTS film was 1.0 micron thick. Film E contained substantially more carbon than other HMCTS films. The carbon was dispersed throughout the film in carbon-rich regions. FIG. 16 illustrates two SEM micrographs of the polymer formed from HMCTS at two levels of magnification and shows the carbon deposits as black dots.

Figure 17:
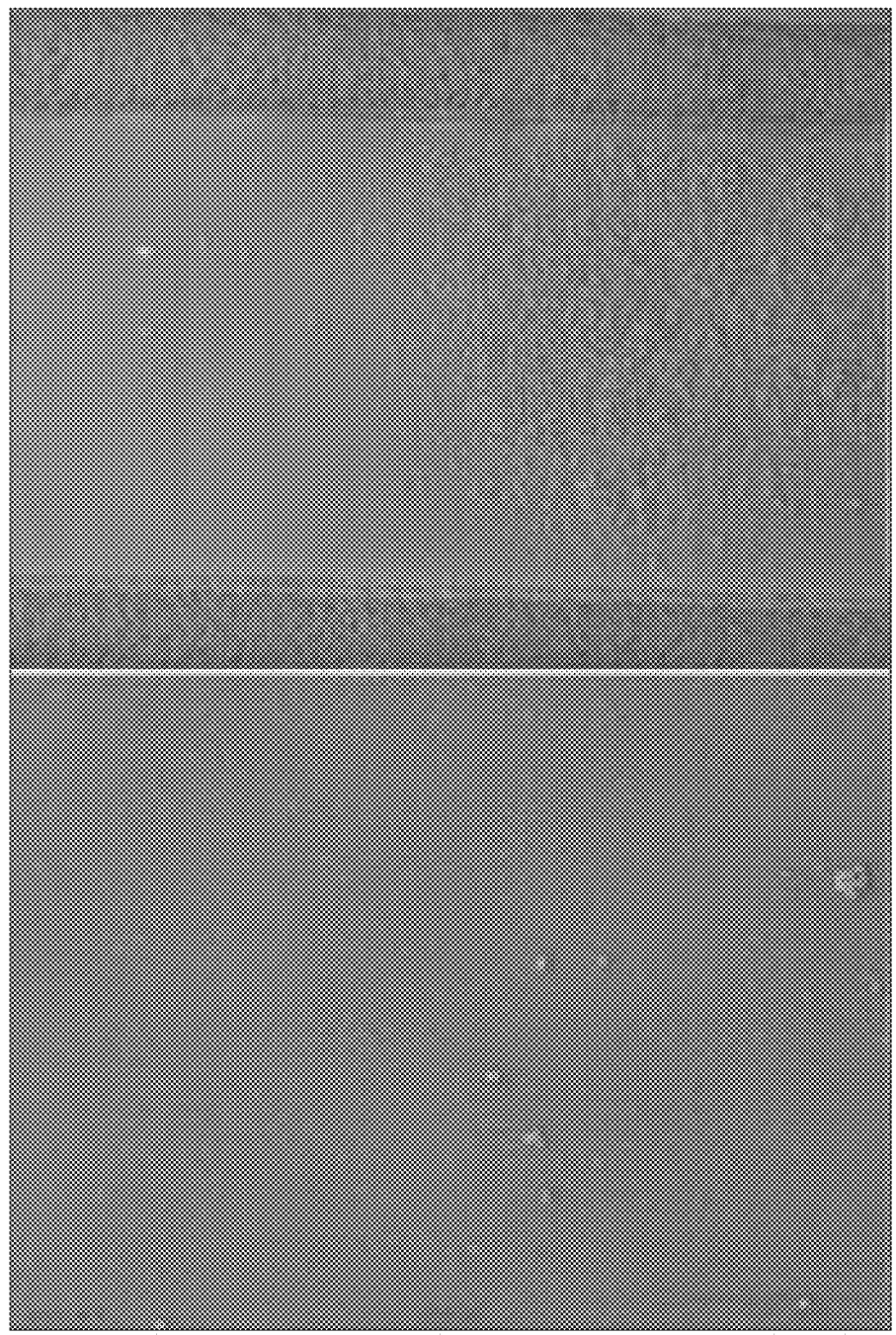
FIG. 17 illustrates two SEM micrographs of an electrode coated with a polymer formed from hexamethylcyclotrisiloxane (HMCTS) at two levels of magnification.

Film F—The polysiloxane film was formed from HMCTS. This film was applied using a process pressure of approximately 318 mTorr. The HMCTS monomer was heated to 120° C. The plasma power was 40 W. The HMCTS film was 0.9 microns thick. FIG. 17 illustrates two SEM micrographs of the polymer formed from HMCTS at two levels of magnification and shows the roughness of the film.

Figure 18:
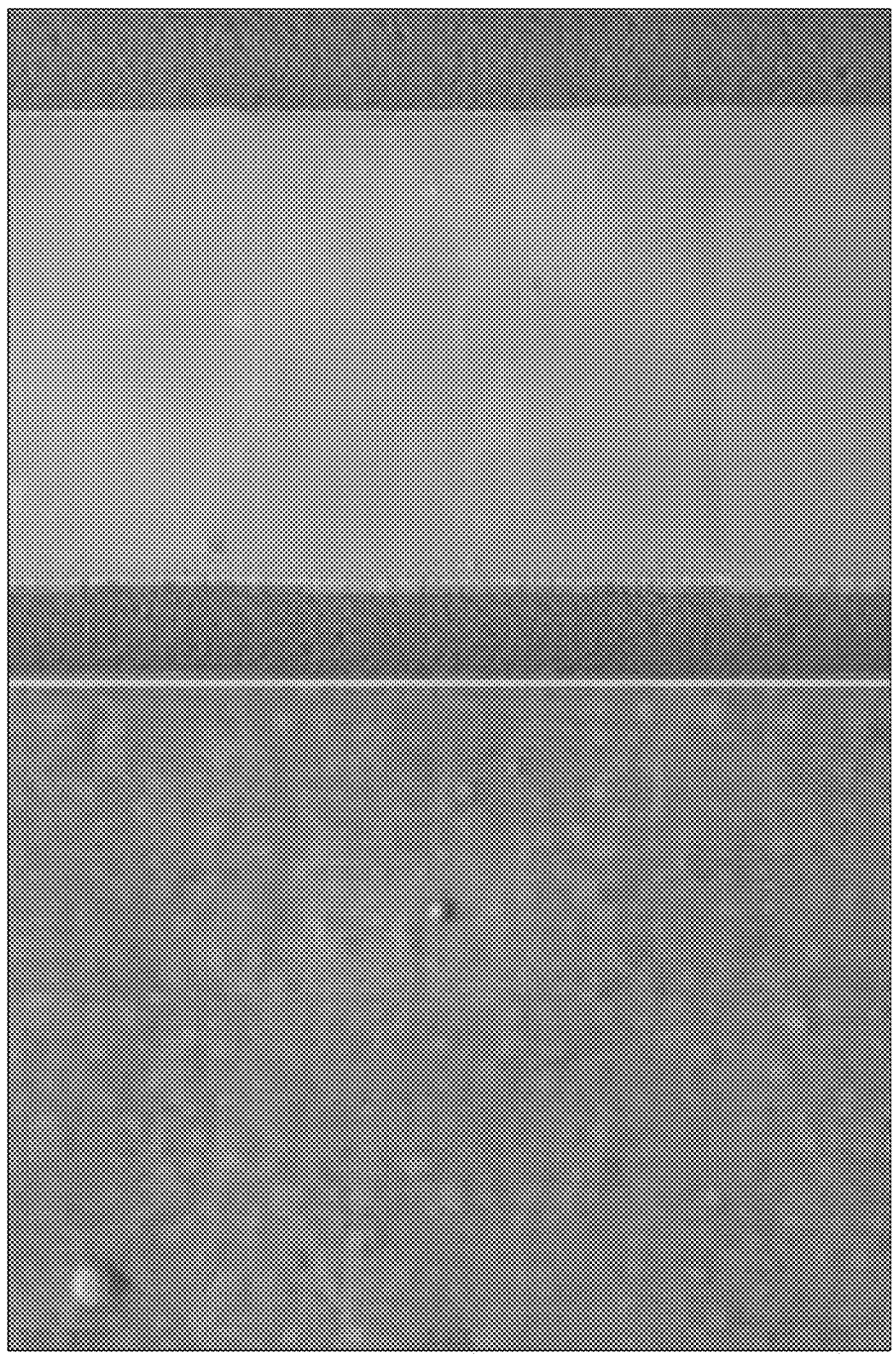
FIG. 18 illustrates two SEM micrographs of an electrode coated with a polymer formed from hexamethylcyclotrisiloxane (HMCTS) at two levels of magnification.

Film G—The polysiloxane film was formed from HMCTS. This film was applied using argon gas containing oxygen in a 1:2 argon:oxygen ratio at a process pressure of 243 mTorr. The HMCTS monomer was heated to 120° C. The plasma power was 40 W. The HMCTS film was 0.5 microns thick. FIG. 18 illustrates two SEM micrographs of the polymer formed from HMCTS at two levels of magnification and shows the uniform smoothness of the film.

The corrosion current of electrodes coated with Films A-G were measured. Coated PCBs received two corrosion exposures. The PCBs were subjected to an initial corrosion exposure, were dried, and then were subjected to a second corrosion exposure. Corrosion current was measured by standard techniques using a FLUKE true RMS multimeter placed in series in the circuit.

The results of the corrosion current after the initial corrosion exposure are shown in Table 2.

TABLE 2

Corrosion current after initial corrosion exposure

| V (dc) | Film A PETMS/ PFDTES (mA) | Film B PETMS (mA) | Film C PETMS (mA) | Film D HMCTS (mA) | Film E HMCTS (mA) | Film F HMCTS (mA) | Film G HMCTS (mA) |
|---|---|---|---|---|---|---|---|
| 2 | 0.00009 | 0.00009 | 0.00009 | 0.00008 | 0.00010 | 0.00010 | 0.00008 |
| 4 | 0.00017 | 0.00036 | 0.00018 | 0.00008 | 0.00015 | 0.00012 | 0.00009 |
| 6 | 0.00037 | 0.00051 | 0.00050 | 0.00008 | 0.00054 | 0.00014 | 0.00023 |
| 8 | 0.00084 | 0.00081 | 0.05800 | 0.00010 | 0.00060 | 0.00012 | 0.00024 |
| 10 | 0.00103 | 0.00130 | 0.00050 | 0.00011 | 0.00088 | 0.00015 | 0.00036 |

The results of the corrosion current after the second corrosion exposure are shown in Table 3.

TABLE 3

Corrosion current after second corrosion exposure

| V (dc) | Film A PETMS/ PFTES (mA) | Film B PETMS (mA) | Film C PETMS (mA) | Film D HMCTS (mA) | Film E HMCTS (mA) | Film F HMCTS (mA) | Film G HMCTS (mA) |
|---|---|---|---|---|---|---|---|
| 2 | 0.00018 | 0.00027 | 0.00041 | 0.00008 | 0.00020 | 0.00011 | 0.00017 |
| 4 | 0.00040 | 0.00085 | 0.00169 | 0.00012 | 0.00064 | 0.00014 | 0.00032 |
| 6 | 0.00061 | 0.00145 | 0.00234 | 0.00008 | 0.00076 | 0.00015 | 0.00045 |
| 8 | 0.00078 | 0.00223 | 0.00290 | 0.00010 | 0.00077 | 0.00020 | 0.00036 |
| 10 | 0.00092 | 0.00337 | 0.00324 | 0.00014 | 0.00099 | 0.00024 | 0.00063 |

Films A-G demonstrate corrosion current that is approximately 100 to 1,000 times lower than current commercially available films. The polysiloxane films provide significantly better protection from water than existing films.

The contact resistance as a function of pogo pin load of electrodes coated with Films A-G was measured. Contact resistance was measured as described in Example 4.

Figure 10:
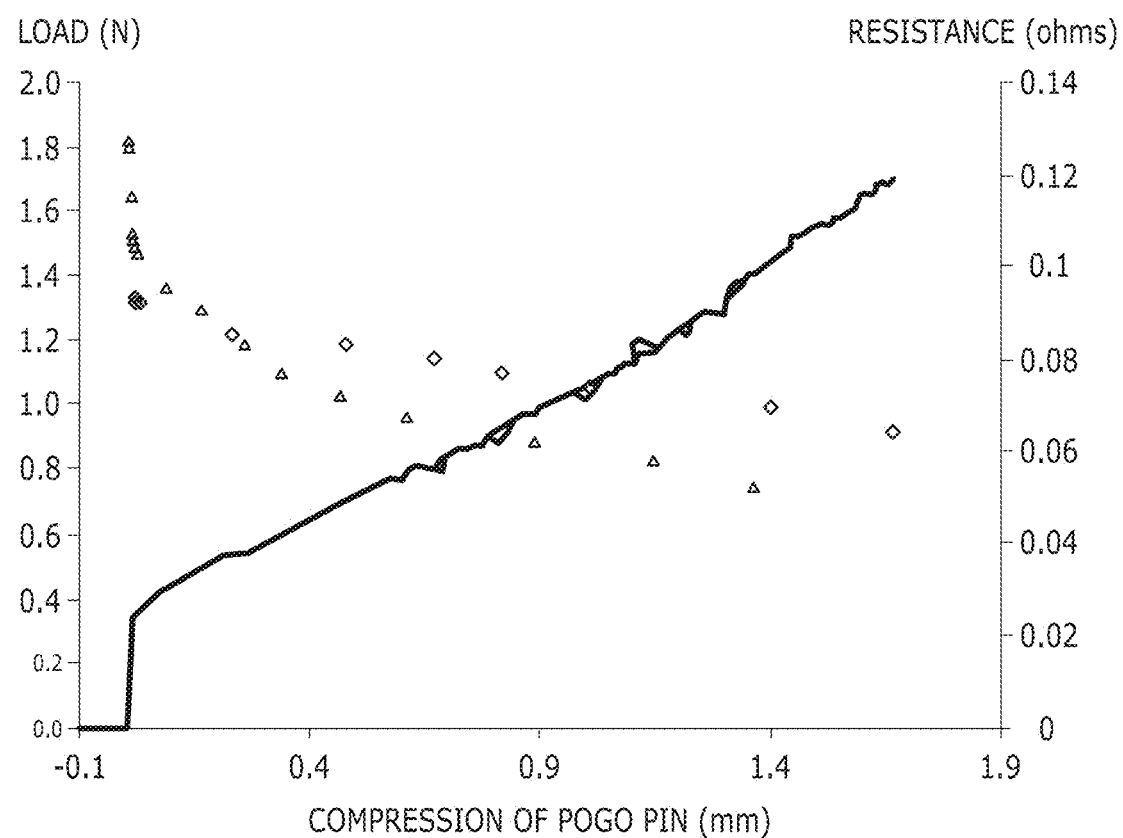
FIG. 10 illustrates a graph of contact resistance as a function of pogo pin load for electrodes coated with a polymer formed from phenethyltrimethoxysilane PETMS and perfluorododecyltriethoxysilane (PFDTES)—two measurements are shown.

FIG. 10 illustrates a graph of contact resistance as a function of pogo pin load for two measurements of Film A. The solid light gray and dark gray lines show the load as a function of pogo pin compression for each measurement of the polymer formed from PETMS/PFDTES. The triangle-shaped and diamond-shaped data points represent the contact resistance of the polymer formed from PETMS/ PFDTES. As compared with Example 4, the contact resistance of Film A is 10 to 20 times greater than the uncoated electrodes and the commercially available fluorinated films. It was theorized that the presence of fluorinated material in Film A is not dense and enables measurable electrical contact resistance, even though the corrosion current is very low.

Figure 11:
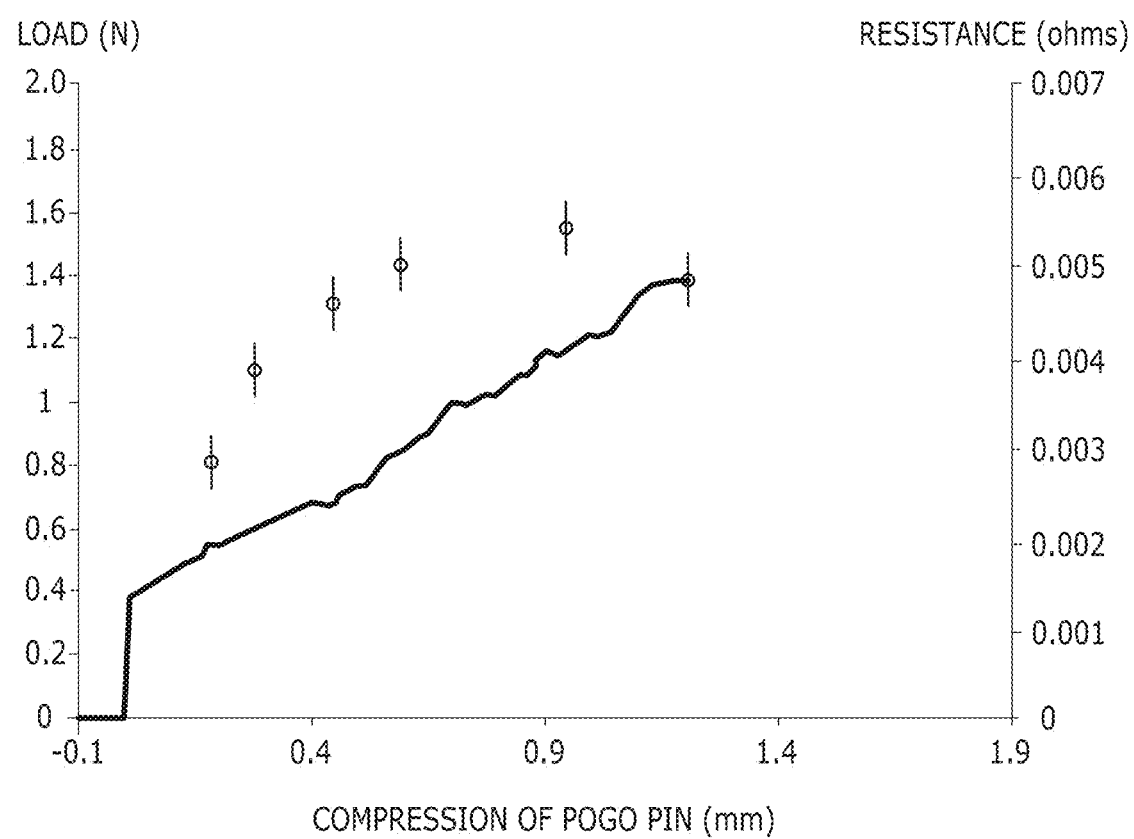
FIG. 11 illustrates a graph of contact resistance as a function of pogo pin load for electrodes coated with a polymer formed from hexamethylcyclotrisiloxane (HMCTS) heated to 75° C., at a process pressure of approximately 301 mTorr and a plasma power of 40 W (Film D)—a very rough polymer surface was obtained.

FIG. 11 illustrates a graph of contact resistance as a function of pogo pin load for Film D. The solid line shows the load as a function of pogo pin compression. The diamond-shaped data points represent the contact resistance. Film D was greater than 1-micron thick, was soft and friable, and had a rough surface morphology. When the pogo pin compressed Film D, the contact resistance resembled that of an uncoated electrode, even though the corrosion current was very low. It was theorized that normal pressure on Film D disrupts the local film structure surrounding large topographic structures, enabling electrical flow.

The contact resistance for Films B, C, E, F and G was also measured. The resistance as a function of pogo pin load was infinite. Thus, Films A-F demonstrate contact resistance that is significantly better than current commercially-available films.

The results of the corrosion current and contact resistance experiments show polysiloxane films of the present application create electron-rich barriers to ionic diffusion and electron conduction that substantially improve protection against moisture damage and ingress. The films represent a marked improvement over commercially-available technologies.

What is claimed is:

1. A polysiloxane film comprising:
   Si—O bonds generated by polymerizing monomers comprising
   at least one linear siloxane monomer having a formula selected from the group consisting of:
   $(X1)_n Si(R1)_{4-n}$, wherein n is 1, 2 or 3;
   $(X1)Si(R1)_2 OSi(R1)_2(X1)$; and
   $(X1)(Si(R1)_2 O)_2 Si(R1)_2(X1)$;
   wherein X1 is OR2, R2 is alkyl, and each R1 is independently selected from the group consisting of amino, hydroxyl, mercapto, alkoxy, alkyl, cycloalkyl, aryl, and heteroaryl;
   a non-volatile diluent selected from the group consisting of alkyl and aryl hydrocarbons having 4-9 carbon atoms, the non-volatile diluent swelling the polysiloxane film,
   wherein the polysiloxane film has a thickness of 0.3 to 1.5 microns and forms contoured regions on a surface coated with the polysiloxane film that have a width from 0.1 to 3.0 microns and a length that is at least five times greater than the width, the polysiloxane film passes a corrosion current test, and the polysiloxane film passes a contact resistance test.

2. The polysiloxane film of claim 1, wherein the polysiloxane film provides IPx7 protection from ingress of water.

3. The polysiloxane film of claim 1, wherein the polysiloxane film has a thickness of 0.5 to 1.1 microns.

4. The polysiloxane film of claim 1, wherein the polysiloxane film comprises fluorine.

5. The polysiloxane film of claim 1, wherein the polysiloxane film comprises carbon deposits.

6. The polysiloxane film of claim 1, wherein the polysiloxane film has a thickness of 0.5 to 1.1 microns, the polysiloxane film provides IPx7 protection from ingress of water, and the polysiloxane film comprises fluorine.

7. The polysiloxane film of claim 1, wherein the polysiloxane film further comprises $(SiO)(R1)_2$ units that are separate from the linear siloxane monomer, wherein each R1 is independently selected from the group consisting of amino, hydroxyl, mercapto, alkoxy, alkyl, cycloalkyl, aryl and heteroaryl.

8. The polysiloxane film of claim 7, wherein R1 is substituted with a substituent selected from the group consisting of alkyl, cycloalky, aryl, heteroaryl, amino, hydroxyl, mercapto, alkoxy, a carboxylic acid, phenethyl, a phosphonic acid, a sulfonic acid, a carboxylic ester, a carboxylic amide, a carboxylic anhydride, a saccharide, a halogen, and salts thereof.

9. An electronic device comprising electrical components coated with the polysiloxane film of claim 1.

10. An electronic device comprising electrical components coated with the polysiloxane film of claim 2.

* * * * *